(12) United States Patent
Park et al.

(10) Patent No.: US 9,893,133 B2
(45) Date of Patent: Feb. 13, 2018

(54) ORGANIC LIGHT EMITTING DIODE DISPLAY INCLUDING PENETRATED PORTION

(71) Applicant: SAMSUNG DISPLAY CO., LTD., Yongin, Gyeonggi-Do (KR)

(72) Inventors: Gyung Soon Park, Seoul (KR); Il Gon Kim, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/726,319

(22) Filed: May 29, 2015

(65) Prior Publication Data
US 2016/0035806 A1    Feb. 4, 2016

(30) Foreign Application Priority Data
Jul. 29, 2014  (KR) .......................... 10-2014-0096818

(51) Int. Cl.
| | | |
|---|---|---|
| H01L 29/08 | (2006.01) | |
| H01L 35/24 | (2006.01) | |
| H01L 51/00 | (2006.01) | |
| H01L 27/32 | (2006.01) | |
| H01L 51/52 | (2006.01) | |

(52) U.S. Cl.
CPC ........ *H01L 27/3258* (2013.01); *H01L 27/326* (2013.01); *H01L 27/3246* (2013.01); *H01L 51/5256* (2013.01); *H01L 51/5281* (2013.01); H01L 2251/5338 (2013.01)

(58) Field of Classification Search
CPC ............... H01L 27/326; H01L 27/3258; H01L 2251/5338; H01L 51/5234; H01L 51/5281; H01L 51/5256; H01L 51/5215
USPC ............ 257/88, 40; 438/151, 29, 34; 345/76
See application file for complete search history.

(56) References Cited

U.S. PATENT DOCUMENTS

| | | | | |
|---|---|---|---|---|
| 2008/0197342 A1* | 8/2008 | Lee | ...................... | H01L 27/3244 257/40 |
| 2011/0169720 A1* | 7/2011 | Hwang | ............... | H01L 27/3258 345/76 |
| 2012/0049215 A1* | 3/2012 | Yoon | ..................... | H01L 27/326 257/91 |
| 2012/0206676 A1* | 8/2012 | Chung | .............. | G02F 1/133516 349/97 |
| 2012/0256202 A1* | 10/2012 | Lee | ..................... | H01L 51/5256 257/88 |
| 2012/0326194 A1* | 12/2012 | Son | ..................... | H01L 51/5259 257/98 |

(Continued)

FOREIGN PATENT DOCUMENTS

| | | |
|---|---|---|
| JP | 4957175 B2 | 3/2012 |
| KR | 10-0934480 B1 | 12/2009 |

(Continued)

*Primary Examiner* — Lex Malsawma
*Assistant Examiner* — Nduka Ojeh
(74) *Attorney, Agent, or Firm* — Lewis Roca Rothgerber Christie LLP (57) ABSTRACT

An organic light emitting diode (OLED) display includes a substrate including a penetrated portion positioned in a display area for displaying an image and a light emission region neighboring the penetrated portion. The OLED display also includes an OLED positioned on the light emission region of the substrate.

18 Claims, 4 Drawing Sheets

(56) References Cited

U.S. PATENT DOCUMENTS

| | | | | |
|---|---|---|---|---|
| 2014/0183471 A1* | 7/2014 | Heo | .................. | H01L 27/322 257/40 |
| 2014/0374759 A1* | 12/2014 | Kim | .................. | H01L 27/1259 257/59 |
| 2016/0172633 A1* | 6/2016 | Ahn | .................. | H01L 27/3267 257/40 |
| 2016/0233289 A1* | 8/2016 | Son | .................. | H01L 27/3258 |

FOREIGN PATENT DOCUMENTS

| KR | 100934480 B1 * | 12/2009 |
|---|---|---|
| KR | 10-1084240 B1 | 11/2011 |
| KR | 10-2012-0089950 A | 8/2012 |
| KR | 10-1308200 | 9/2013 |

* cited by examiner

ORGANIC LIGHT EMITTING DIODE DISPLAY INCLUDING PENETRATED PORTION

CROSS-REFERENCE TO RELATED APPLICATION

This application claims priority to and the benefit of Korean Patent Application No. 10-2014-0096818, filed in the Korean Intellectual Property Office on Jul. 29, 2014, the entire content of which is incorporated herein by reference.

BACKGROUND

1. Field

Aspects of one or more embodiments of the present invention relate to an organic light emitting diode (OLED) display, and more particularly, to a transparent organic light emitting diode (OLED) display.

2. Description of the Related Art

Generally, well-known flat panel displays (FPDs) include organic light emitting diode (OLED) displays, liquid crystal displays (LCD), and plasma display panels.

Among them, an OLED display includes an organic light emitting diode (OLED) for emitting light.

Recently, an OLED display further including a light transmissive part neighboring the OLED has been developed, which allows the OLED display to be transparent.

The above information disclosed in this Background section is only for enhancing the understanding of the background of the invention and, therefore, it may contain information that is not prior art already known in this country to a person of ordinary skill in the art.

SUMMARY

Aspects of one or more embodiments of the present invention are directed toward a more transparent organic light emitting diode (OLED) display by including a penetrated portion as a light transmissive part.

Aspects of one or more embodiments one or more embodiments of the present invention are directed toward a more flexible OLED display by including the penetrated portion as the light transmissive part.

Aspects of one or more embodiments of the present invention are directed toward an OLED display for suppressing stress due to bending from being concentrated on a specific region by including the penetrated portion as the light transmissive part.

One embodiment of the present invention provides an organic light emitting diode (OLED) display, including: a substrate including a penetrated portion in a display area for displaying an image and a light emission region neighboring the penetrated portion; and an OLED on the light emission region of the substrate.

The substrate may be flexible.

The substrate may include an organic material.

The substrate may include a plurality of penetrated portions, and each of the plurality of penetrated portions may be separated from each other.

The plurality of penetrated portions may be arranged in a matrix form across the substrate.

The OLED display may further include a thin film transistor between the substrate and the OLED and coupled to the OLED.

The OLED display may further include a first insulating layer neighboring the thin film transistor, wherein the first insulating layer may extend from the thin film transistor to above a side wall of the substrate adjacent the penetrated portion.

The thin film transistor may include: an active layer on the substrate; a gate electrode on the active layer; and source and drain electrodes on the gate electrode and coupled to the active layer.

The first insulating layer may include: a first sub-insulating layer between the substrate and the active layer; a second sub-insulating layer on the first sub-insulating layer and covering the active layer; and a third sub-insulating layer on the second sub-insulating layer and covering the gate electrode.

The first sub-insulating layer, the second sub-insulating layer, and the third sub-insulating layer may be sequentially laminated on the side wall of the substrate.

The OLED display may further include a second insulating layer neighboring the OLED, where the second insulating layer may extend from the OLED to above a side wall of the substrate.

The second insulating layer may cover the thin film transistor.

The OLED may include: a first electrode coupled to the thin film transistor; an organic emission layer on the first electrode; and a second electrode on the organic emission layer.

The second insulating layer may include: a fourth sub-insulating layer between the thin film transistor and the first electrode; and a fifth sub-insulating layer between the fourth sub-insulating layer and the second electrode.

The fourth and fifth sub-insulating layers may be sequentially laminated on the side wall of the substrate.

The OLED display may further include a thin film encapsulation layer on the OLED.

The thin film encapsulation layer may extend from the OLED to above a side wall of the substrate adjacent the penetrated portion.

The thin film encapsulation layer may include a plurality of layers, and the uppermost one of the plurality of layers may include an inorganic material.

Any one of the plurality of layers of the thin film encapsulation layer may be a patterned metal layer.

The OLED display may further include: a first polarizer attached to a surface of the thin film encapsulation layer and covering the penetrated portion; and a second polarizer attached to a rear side of the substrate and covering the penetrated portion.

According to the exemplary embodiments of the present invention, a more transparent OLED display may be provided by including the penetrated portion, which is light transmissive.

Further, a more flexible OLED display may be provided by including the penetrated portion.

In addition, by including the penetrated portion, the OLED display may reduce the amount of stress placed on components of the OLED display and may reduce damage from such stress being concentrated on a specific region, where the stress was generated due to bending.

DETAILED DESCRIPTION

The present invention will be described more fully hereinafter with reference to the accompanying drawings, in which exemplary embodiments of the invention are shown.

As those skilled in the art would realize, the described embodiments may be modified in various different ways, all without departing from the spirit or scope of the present invention.

Parts that are irrelevant to the description may be omitted to clearly describe the present invention, and the same or similar constituent elements will be designated by the same reference numerals throughout the specification.

Further, in various exemplary embodiments, a first exemplary embodiment is representatively described using the same reference numerals for constituent elements having the same configuration, and in other exemplary embodiments, only configurations different from the first exemplary embodiment may be described.

Also, when a first element is described as being "coupled to" or "connected to" a second element, the first element may be directly "coupled to" or "connected to" the second element or indirectly "coupled to" or "connected to" the second element with one or more intervening elements interposed therebetween.

Further, in the drawings, size and thickness of each element are arbitrarily illustrated for ease of description, and the present invention is not necessarily limited to those sizes and thicknesses illustrated in the drawings. Further, the use of "may" when describing embodiments of the inventive concept refers to "one or more embodiments of the inventive concept." Also, the term "exemplary" is intended to refer to an example or illustration. As used herein, the terms "use," "using," and "used" may be considered synonymous with the terms "utilize," "utilizing," and "utilized," respectively.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

In the drawings, the thickness of layers, films, panels, regions, etc. are exaggerated for clarity.

In the drawings, for ease of description, the thicknesses of some layers and regions are exaggerated.

It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements.

Further, in the specification, the word "on" refers to positioning on or below the object portion, and does not necessarily refer to positioning on the upper side of the object portion based on a gravity direction.

An organic light emitting diode (OLED) display according to an exemplary embodiment of the present invention will now be described with reference to FIGS. 1 and 2.

Figure 1:
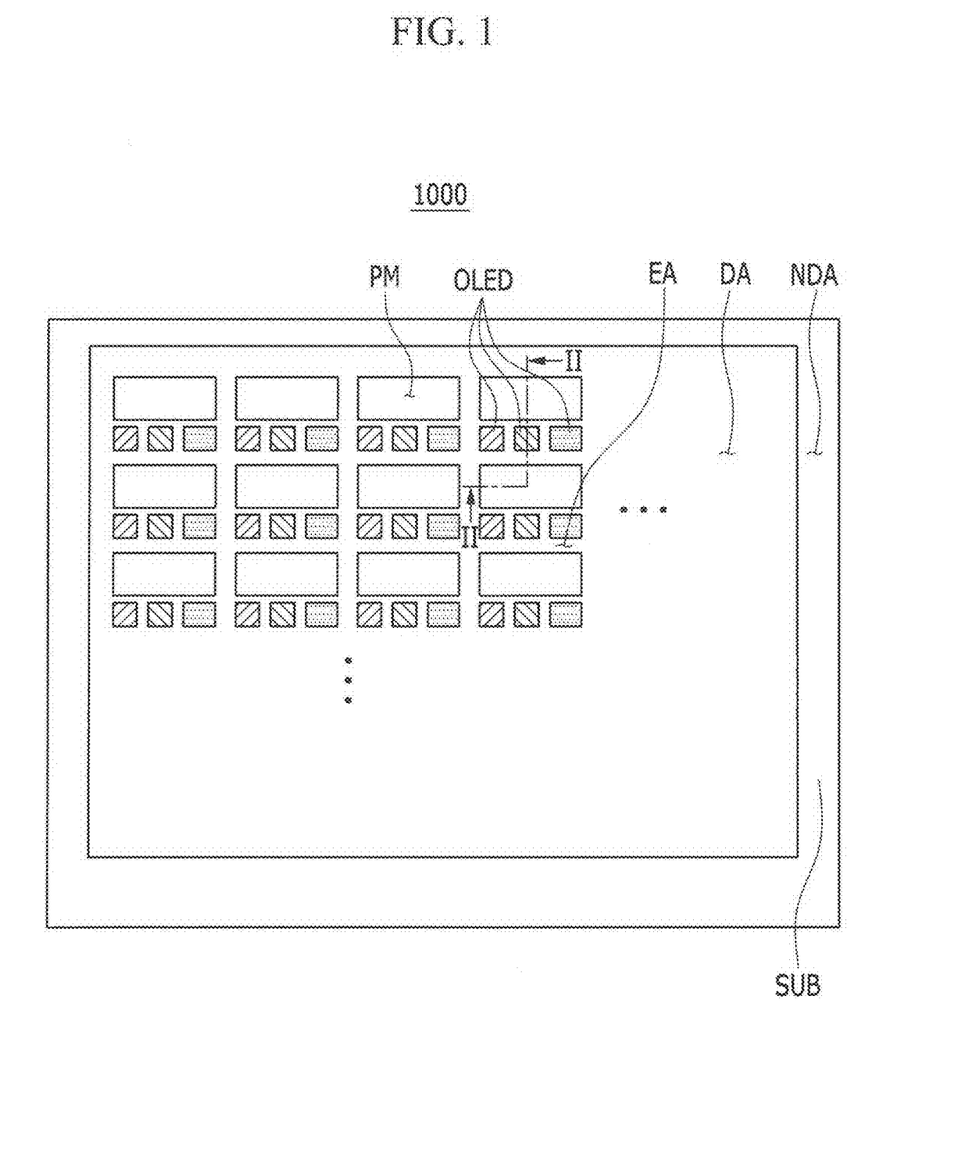
FIG. 1 is a top plan view schematically illustrating an organic light emitting diode (OLED) display according to an exemplary embodiment of the present invention.

FIG. 1 is a top plan view schematically illustrating the OLED display according to the exemplary embodiment of the present invention.

As shown in FIG. 1, the OLED display 1000 according to the exemplary embodiment of the present invention is a transparent display device including a display area DA for displaying an image and a non-display area NDA neighboring the display area DA, and includes a substrate SUB including a penetrated portion PM and an OLED for emitting light.

The OLED display 1000 is recognized as a transparent display device by light that passes through the penetrated portion PM.

Figure 2:
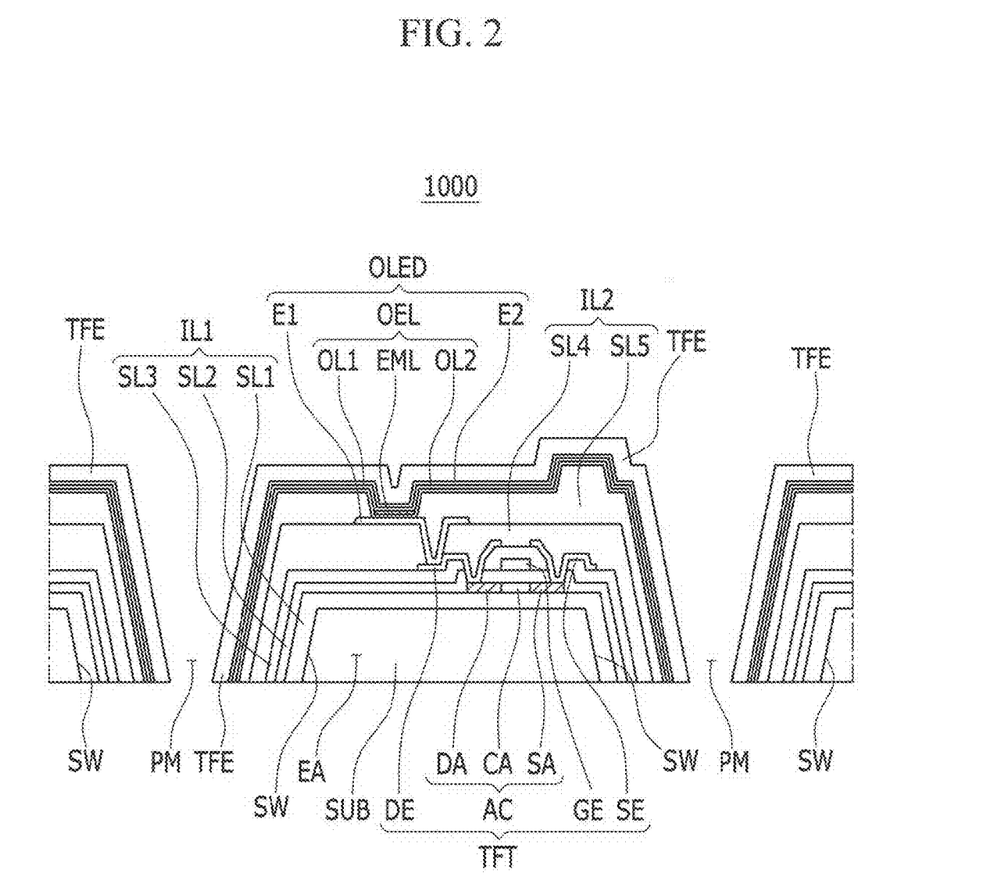
FIG. 2 is a cross-sectional view of FIG. 1 taken along the line II-II.

FIG. 2 is a cross-sectional view of FIG. 1 taken along the line II-II.

As shown in FIGS. 1 and 2, the OLED display 1000 includes the substrate SUB, the OLED, a thin film transistor TFT, a first insulating layer IL1, a second insulating layer IL2, and a thin film encapsulation layer TFE.

The substrate SUB includes an organic material including polyethylene terephthalate (PET), polyimide (PI), polycarbonate (PC), epoxy, polyethylene (PE), and/or polyacrylate (PA).

The substrate SUB may be formed as a film, and in some embodiments, the OLED display 1000 may have a flexible property, a stretchable property, and/or a rollable property.

In some embodiments, the substrate SUB may be formed of an insulating substrate such as glass, quartz, ceramics, etc., or a metallic substrate made of stainless steel or the like.

The substrate SUB includes the penetrated portion PM and a light emission area EA that are positioned to correspond to the display area DA.

The penetrated portion PM has a hole-like shape through which the substrate SUB is penetrated.

A plurality of penetrated portions PM may be provided, and each penetrated portion PM of the plurality of penetrated portions PM is separated from each other.

The plurality of penetrated portions PM are arranged in a matrix form across the entire substrate SUB.

In another embodiment, the plurality of penetrated portions PM may be arranged in an unstructured network topology.

A side wall SW of the substrate SUB forming the penetrated portion PM is tapered but is not limited thereto. For example, the side wall SW of the substrate SUB forming the penetrated portion PM may be perpendicular to a top or bottom surface of the substrate SUB.

Because light passes through the penetrated portion PM, the OLED display 1000 may be transparent.

The light emission area EA neighbors the penetrated portion PM and is positioned between penetrated portions PM that neighbor each other.

The OLED is positioned on the light emission area EA.

The OLED may be formed to correspond to one pixel.

Here, a pixel refers to a minimum unit to display an image.

The OLED includes a first electrode E1, an organic emission layer OEL, and a second electrode E2.

The first electrode E1 is positioned on the substrate SUB, and is coupled to the thin film transistor TFT through a contact hole (i.e., contact opening).

The first electrode E1 may include one or more of a light reflective electrode, a light transmissive electrode, and a light transflective electrode.

The first electrode E1 may be formed as either an anode electrode or a cathode electrode.

The first electrode E1 may be formed to correspond to one pixel.

The organic emission layer OEL is positioned on the first electrode E1.

The organic emission layer OEL includes: a first organic layer OL1 including one or more of a hole injection layer (HIL), a hole transporting layer (HTL), an electron transporting layer (ETL), and an electron injection layer (EIL); a primary emission layer EML positioned on the first organic layer OL1; and a second organic layer OL2 positioned on the primary emission layer EML and including one or more of a hole injection layer (HIL), a hole transporting layer (HTL), a electron transporting layer (ETL), and a electron injection layer (EIL).

The primary emission layer EML of the organic emission layer OEL may include a red organic emission layer for emitting red light, a green organic emission layer for emitting green light, and a blue organic emission layer for emitting blue light, and the red organic emission layer, the green organic emission layer, and the blue organic emission layer are formed on a red pixel, a green pixel, and a blue pixel, respectively, thereby providing a color image.

Further, the primary emission layer EML of the organic emission layer OEL may provide the color image by integrally laminating or stacking the red organic emission layer, the green organic emission layer, and the blue organic emission layer together in the red pixel, the green pixel, and the blue pixel, and then forming a red color filter for the red pixel, a green color filter for the green pixel, and a blue color filter for the blue pixel.

As another example, white organic emission layers for emitting white light are formed in all of the red pixel, the green pixel, and the blue pixel, and a red color filter for the red pixel, a green color filter for the green pixel, and a blue color filter for the blue pixel are formed, thereby providing the color image.

When the color image is implemented using the white organic emission layer and the color filter, a deposition mask for depositing the red organic emission layer, the green organic emission layer, and the blue organic emission layer on each pixel, that is, the red pixel, the green pixel, and the blue pixel, is not required.

The white organic emission layer described in another exemplary embodiment may be formed as a single organic emission layer, or may include a configuration in which a plurality of organic emission layers are laminated to emit white light.

As an example, the white organic emission layer may further include a configuration in which at least one yellow organic emission layer and at least one blue organic emission layer are combined to emit white light, a configuration in which at least one cyan organic emission layer and at least one red organic emission layer are combined to emit white light, or a configuration in which at least one magenta organic emission layer and at least one green organic emission layer are combined to emit white light.

The second electrode E2 is positioned on the organic emission layer OEL.

The second electrode E2 may include one or more of a light reflective electrode, a light transmissive electrode, and a light transflective electrode.

The second electrode E2 may be formed as either an anode electrode or a cathode electrode.

The second electrode E2 may be formed as one circular disk, and may be positioned across a plurality of pixels.

The thin film transistor TFT is positioned between the substrate SUB and the OLED, and is coupled to the OLED.

The thin film transistor TFT includes an active layer AC, a gate electrode GE, a source electrode SE, and a drain electrode DE.

The active layer AC is positioned on the substrate SUB and includes a source region SA, a channel region CA, and a drain region DA, and may be formed of polysilicon or an oxide semiconductor.

The oxide semiconductor may include an oxide of titanium (Ti), hafnium (Hf), zirconium (Zr), aluminum (Al), tantalum (Ta), germanium (Ge), zinc (Zn), gallium (Ga), tin (Sn), or indium (In), or complex oxides thereof, such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O).

The source region SA and the drain region DA may be respectively doped with impurities, and the type (kind) of thin film transistor used may determine the doped impurities, which may be n-type impurities or p-type impurities.

The gate electrode GE is positioned on the active layer AC, and corresponds to the channel region CA of the active layer AC.

The source electrode SE and the drain electrode DE are positioned on the active layer AC and the gate electrode GE, and are respectively coupled to the source region SA and the drain region DA through contact holes (i.e., contact openings), as shown in FIG. 2.

The thin film transistor TFT described above may be included, for ease of description, in a pixel circuit.

The pixel circuit may include a plurality of thin film transistors, one or more capacitors, a plurality of scan lines, one or more data lines, etc., and may be formed to have various suitable structures that those skilled in the art may easily modify and implement.

The first insulating layer IL1 neighbors the thin film transistor TFT and extends from the thin film transistor TFT to the side wall SW of the substrate SUB adjacent the penetrated portion PM.

The first insulating layer IL1 includes a first sub-insulating layer SL1, a second sub-insulating layer SL2, and a third sub-insulating layer SL3.

The first sub-insulating layer SL1 is positioned between the substrate SUB and the active layer AC, and may include an organic and/or inorganic material, such as a silicon oxide (SiOx), a silicon nitride (SiNx), or the like.

The first sub-insulating layer SL1 may be formed as a single layer or multiple layers.

The second sub-insulating layer SL2 is positioned on the first sub-insulating layer SL1 and covers the active layer AC.

The second sub-insulating layer SL2 may include an organic and/or inorganic material, such as a silicon oxide (SiOx), a silicon nitride (SiNx), or the like.

The second sub-insulating layer SL2 may be formed as a single layer or multiple layers.

The source and drain electrodes SE and DE are each coupled to the active layer AC through the contact holes (i.e., contact openings) that are formed in the second sub-insulating layer SL2.

The third sub-insulating layer SL3 is positioned on the second sub-insulating layer SL2 and covers the gate electrode GE.

The third sub-insulating layer SL3 may include an organic and/or inorganic material, such as a silicon oxide (SiOx), a silicon nitride (SiNx), or the like.

The third sub-insulating layer SL3 may be formed as a single layer or multiple layers.

Contact holes (i.e., contact openings) formed in the third sub-insulating layer SL3 are connected to the contact holes (i.e., contact openings) that are formed in the second sub-insulating layer SL2, and the source and drain electrodes SE and DE are respectively coupled to the active layer AC though the contact holes (i.e., contact openings).

The first sub-insulating layer SL1, the second sub-insulating layer SL2, and the third sub-insulating layer SL3 each extend from the thin film transistor TFT to above the side wall SW that forms the penetrated portion PM of the substrate SUB, and accordingly, the first sub-insulating layer SL1, the second sub-insulating layer SL2, and the third sub-insulating layer SL3 are respectively sequentially laminated on the side wall SW of the substrate SUB.

The second insulating layer IL2 neighbors the OLED and covers the thin film transistor TFT, and extends from the OLED to above the side wall SW of the substrate SUB.

The second insulating layer IL2 includes a fourth sub-insulating layer SL4 and a fifth sub-insulating layer SL5.

The fourth sub-insulating layer SL4 is positioned on the source and drain electrodes SE and DE of the thin film transistor TFT and between the thin film transistor TFT and the first electrode E1.

The fourth sub-insulating layer SL4 may include an organic and/or an inorganic material including a photoresist material.

The fourth sub-insulating layer SL4 includes a contact hole (i.e., contact opening) through which the drain electrode DE of the thin film transistor TFT contacts the first electrode E1. The first electrode E1 is coupled to the drain electrode DE through the contact hole (i.e., contact opening).

The fifth sub-insulating layer SL5 is positioned between the fourth sub-insulating layer SL4 and the second electrode E2, and has an opening that exposes a center portion of the first electrode E1.

The fifth sub-insulating layer SL5 includes an organic material including a photoresist material.

A spacer may be positioned on the fifth sub-insulating layer SL5, and the spacer may be integrally formed with the fifth sub-insulating layer SL5, or may be formed of a different material than the fifth sub-insulating layer SL5 by a different process.

The fourth and fifth sub-insulating layers SL4 and SL5 each extend from the OLED to above the side wall SW that forms the penetrated portion PM of the substrate SUB, and accordingly, the fourth and fifth sub-insulating layers SL4 and SL5 are sequentially laminated on the side wall SW of the substrate SUB.

The thin film encapsulation layer TFE is positioned on the OLED and covers the OLED.

The thin film encapsulation layer TFE extends from the OLED to above the side wall SW of the substrate SUB that forms the penetrated portion PM.

The thin film encapsulation layer TFE includes a plurality of layers, and an uppermost one of the plurality of layers is an inorganic layer including an inorganic material.

For example, the thin film encapsulation layer TFE may be formed by alternatingly laminating at least one organic layer and at least one inorganic layer.

In one embodiment, a plurality of organic and/or inorganic layers may be provided.

The organic layer is formed of an organic material, and in a further embodiment, may be a single layer or laminated layers that can be formed of polyethylene terephthalate (PET), polyimide (PI), polycarbonate (PC), epoxy, polyethylene (PE), and/or polyacrylate (PA).

In one embodiment, the organic layer is formed of polyacrylate, and in a further embodiment, it includes a material in which a monomer composition including a diacrylate-based monomer and a triacrylate-based monomer is polymerized.

The monomer composition may further include a monoacrylate-based monomer.

Further, the monomer composition may further include a suitable photoinitiator such as TPO, but it is not limited thereto.

The inorganic layer may be a single layer or laminated layers including a metal oxide or a metal nitride.

In one embodiment, the inorganic layer may include SiNx, $Al_2O_3$, $SiO_2$, and/or $TiO_2$.

As described above, in the OLED display 1000 according to an exemplary embodiment, the substrate SUB includes the penetrated portion PM that is light transmissive, and the first insulating layer IL1, the second insulating layer IL2, and the thin film encapsulation layer TFE extend above the side wall SW of the substrate SUB adjacent the penetrated portion PM. Thus, the light passing through the penetrated portion PM does not pass through any medium except for air; it passes only through the penetrated portion PM, thereby providing a more transparent OLED display 1000.

Further, in some embodiments of the OLED display 1000, the substrate SUB is a flexible organic material arranged in the matrix form and it includes the plurality of penetrated portions PM. This configuration improves the flexibility of the substrate SUB, thereby providing the more flexible OLED display 1000.

Further, in some embodiments of the OLED display 1000, because the substrate SUB is a flexible organic material arranged in the matrix form and it includes the plurality of penetrated portions PM, the stress generated at the substrate SUB due to bending is distributed by the plurality of penetrated portions PM when the overall OLED display 1000 is bent, thereby reducing the amount of stress placed on individual components of the OLED display 1000 and reducing damage due to stress that may be concentrated at a specific region due to the bending.

Further, in the OLED display 1000, since the first insulating layer IL1, the second insulating layer IL2, and the thin film encapsulation layer TFE extend above the side wall SW of the substrate SUB adjacent the penetrated portion PM, moisture permeation into the thin film transistor TFT or OLED through the penetrated portion PM may be suppressed.

Because permeation into the penetrated portion PM is suppressed, even if the substrate SUB includes the penetrated portion PM, the OLED display 100 can prevent or protect from a reduction in the lifespan of the OLED display 1000 due to deterioration caused by moisture permeation through the penetrated portion PM.

An OLED display according to another exemplary embodiment of the present invention will now be described with reference to FIG. 3.

Figure 3:
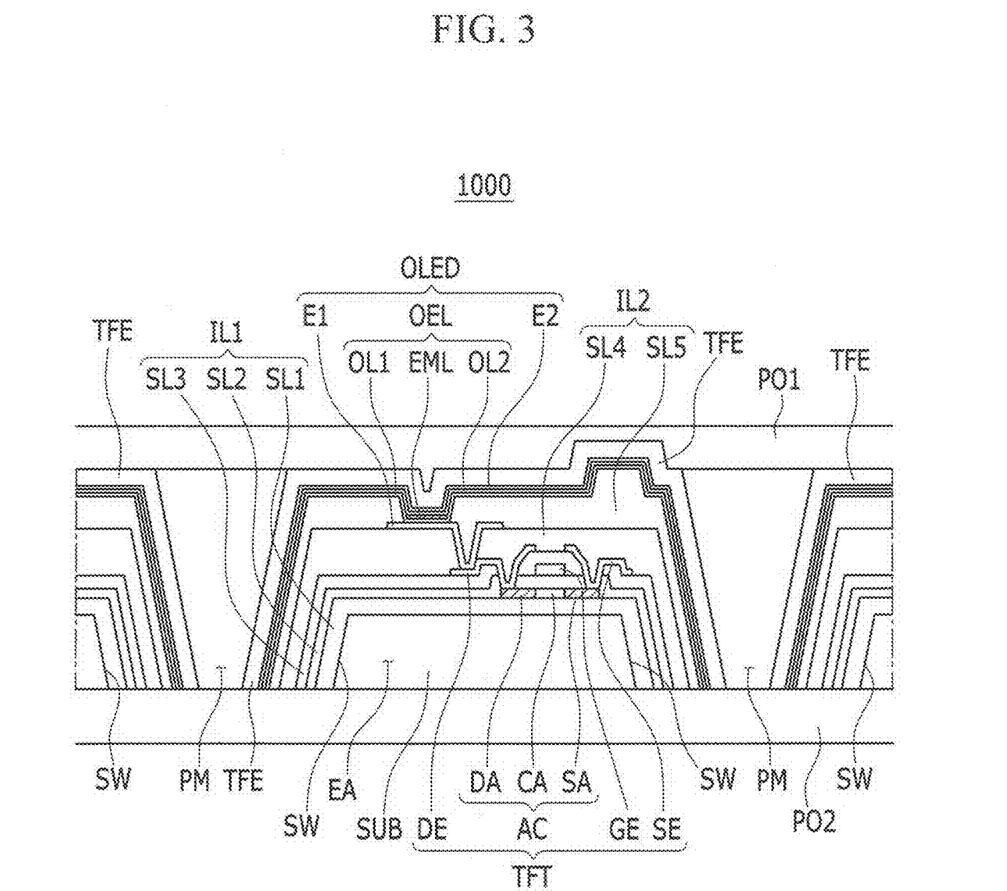
FIG. 3 is a cross-sectional view of an OLED display according to another exemplary embodiment of the present invention.

FIG. 3 is a cross-sectional view of an OLED display according to another exemplary embodiment of the present invention.

As shown in FIG. 3, the OLED display 1000 according to another exemplary embodiment of the present invention includes a substrate SUB, an OLED, a thin film transistor TFT, a first insulating layer IL1, a second insulating layer IL2, a thin film encapsulation layer TFE, a first polarizer PO1, and a second polarizer PO2.

The first polarizer PO1 is attached to a surface of the thin film encapsulation layer TFE and covers a penetrated portion PM.

The second polarizer PO2 is attached to a rear side of the substrate SUB and covers the penetrated portion PM.

The first and second polarizers PO1 and PO2 each include a retarder, and the first and second polarizers PO1 and PO2 may have the same or a substantially similar optical axis.

The first and second polarizers PO1 and PO2 are each configured to suppress reflection of external light, and may have various suitable lamination structures.

Since the first and second polarizers PO1 and PO2 each have the same or a substantially similar optical axis, the light passing through the penetrated portion PM may pass through either the first polarizer PO1 or the second polarizer PO2 and then it easily passes through the other polarizer by way of the penetrated portion PM.

As described above, since the OLED display 1000 according to another exemplary embodiment of the present invention includes the first and second polarizers PO1 and PO2 including the retarders, reflection of the external light by the thin film transistor TFT or OLED is thereby suppressed and less noticeable from the outside.

That is, the OLED display 1000 may suppress the reflection of the external light.

An OLED display according to another exemplary embodiment of the present invention will now be described with reference to FIG. 4.

Figure 4:
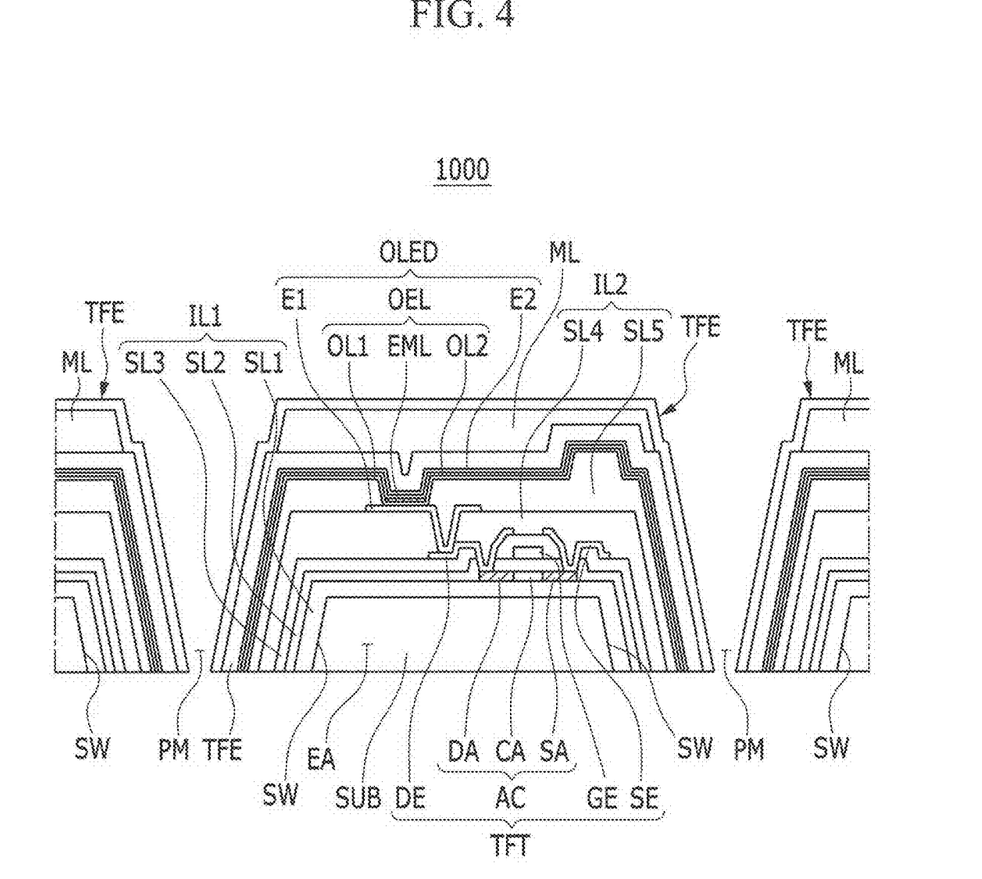
FIG. 4 is a cross-sectional view of an OLED display according to a further exemplary embodiment of the present invention.

FIG. 4 is a cross-sectional view of an OLED display according to a further exemplary embodiment of the present invention.

As shown in FIG. 4, the OLED display 1000 according to the further exemplary embodiment of the present invention includes a substrate SUB, an OLED, a thin film transistor TFT, a first insulating layer IL1, a second insulating layer IL2, and a thin film encapsulation layer TFE.

The thin film encapsulation layer TFE is formed of a plurality of layers, and any one of the plurality of layers is formed of a patterned metal layer ML.

The metal layer ML is configured to suppress reflection of external light, and may be formed as one of various suitable thin film types (kinds) of patterned metal layers.

For example, the metal layer ML may be formed as a wire grid polarizer (WGP), and may serve as a wire grid polarizer to suppress the reflection of the external light.

As described above, in the OLED display 1000 according to the further exemplary embodiment of the present invention, the thin film encapsulation layer TFE includes the patterned metal layer ML for suppressing the reflection of the external light, and thereby the reflection of the external light by the thin film transistor TFT or OLED is suppressed and less noticeable from the outside.

That is, the OLED display 1000 may suppress the reflection of the external light.

While the present invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their respective equivalents.

What is claimed is:

1. An organic light emitting diode (OLED) display comprising:
    a substrate comprising a penetrated portion in a display area for displaying an image, a light emission region neighboring the penetrated portion, and a side wall between the light emission region and the penetrated portion;
    an OLED on the light emission region of the substrate;
    a thin film transistor between the substrate and the OLED and coupled to the OLED, the thin film transistor comprising:
       an active layer on the substrate;
       a gate electrode on the active layer; and
       source and drain electrodes on the gate electrode and coupled to the active layer; and
    a first sub-insulating layer between and directly contacting both the substrate and the active layer, the first sub-insulating layer extending from the light emission region onto the side wall of the substrate,
    wherein the first sub-insulating layer contacts the side wall of the substrate.

2. The OLED display of claim 1, wherein the substrate is flexible.

3. The OLED display of claim 2, wherein the substrate comprises an organic material.

4. The OLED display of claim 1, wherein the penetrated portion comprises a plurality of penetrated portions, and each of the plurality of penetrated portions is separated from one another.

5. The OLED display of claim 4, wherein the plurality of penetrated portions are arranged in a matrix form across the substrate.

6. The OLED display of claim 1, further comprising:
    a second sub-insulating layer on the first sub-insulating layer and covering the active layer; and
    a third sub-insulating layer on the second sub-insulating layer and covering the gate electrode.

7. The OLED display of claim 6, wherein
    the first sub-insulating layer, the second sub-insulating layer, and the third sub-insulating layer are sequentially laminated on the side wall of the substrate.

8. The OLED display of claim 1, further comprising a second insulating layer neighboring the OLED, wherein the second insulating layer extends from the OLED to above the side wall of the substrate.

9. The OLED display of claim 8, wherein the second insulating layer covers the thin film transistor.

10. The OLED display of claim 9, wherein the OLED comprises:
a first electrode coupled to the thin film transistor;
an organic emission layer on the first electrode; and
a second electrode on the organic emission layer.

11. The OLED display of claim 10, wherein the second insulating layer comprises:
a fourth sub-insulating layer between the thin film transistor and the first electrode; and
a fifth sub-insulating layer between the fourth sub-insulating layer and the second electrode.

12. The OLED display of claim 11, wherein the fourth and fifth sub-insulating layers are sequentially laminated on the side wall of the substrate.

13. The OLED display of claim 1, further comprising a thin film encapsulation layer on the OLED.

14. The OLED display of claim 13, wherein the thin film encapsulation layer extends from the OLED to above the side wall of the substrate adjacent the penetrated portion.

15. The OLED display of claim 14, wherein the thin film encapsulation layer comprises a plurality of layers, and the uppermost one of the plurality of layers comprises an inorganic material.

16. The OLED display of claim 15, wherein at least one of the plurality of layers of the thin film encapsulation layer is a patterned metal layer.

17. The OLED display of claim 13, further comprising:
a first polarizer attached to a surface of the thin film encapsulation layer and covering the penetrated portion; and
a second the polarizer attached to a rear side of substrate and covering the penetrated portion.

18. The OLED display of claim 1, wherein an upper surface of the substrate at the light emission region and the side wall of the substrate form an obtuse angle.

* * * * *